(12) United States Patent
Kim et al.

(10) Patent No.: US 12,546,393 B2
(45) Date of Patent: Feb. 10, 2026

(54) SUBSTRATE PROCESSING APPARATUS

(71) Applicant: SAMSUNG ELECTRONICS CO., LTD., Suwon-si (KR)

(72) Inventors: Jihwan Kim, Suwon-si (KR); Dongseok Han, Suwon-si (KR); Kyung-Sun Kim, Suwon-si (KR); Heewon Min, Suwon-si (KR); Mingil Kim, Suwon-si (KR); Yirop Kim, Suwon-si (KR); Junghyun Song, Suwon-si (KR); Kuihyun Yoon, Suwon-si (KR); Woojin Jang, Suwon-si (KR); Seunghee Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/620,395

(22) Filed: Mar. 28, 2024

(65) Prior Publication Data
US 2025/0116332 A1 Apr. 10, 2025

(30) Foreign Application Priority Data
Oct. 4, 2023 (KR) .................. 10-2023-0132002

(51) Int. Cl.
*H01L 21/673* (2006.01)
*F16J 15/10* (2006.01)
*H01L 21/683* (2006.01)

(52) U.S. Cl.
CPC ......... *F16J 15/104* (2013.01); *H01L 21/6732* (2013.01); *H01L 21/6831* (2013.01)

(58) Field of Classification Search
CPC .. H01L 21/6831; H01L 21/6732; F16J 15/104
See application file for complete search history.

(56) References Cited

U.S. PATENT DOCUMENTS

| | | | | |
|---|---|---|---|---|
| 2,915,349 | A * | 12/1959 | Gomberg | F16J 15/32 285/918 |
| 3,698,728 | A * | 10/1972 | Walker | F16J 15/104 277/612 |
| 3,704,021 | A * | 11/1972 | Barbarin | F16L 23/18 285/368 |
| 5,805,408 | A * | 9/1998 | Maraschin | H01L 21/6831 361/234 |
| 7,497,443 | B1 * | 3/2009 | Steinetz | F16J 15/0887 277/647 |
| 10,393,026 | B2 * | 8/2019 | Hillier | F01D 11/08 |
| 10,890,256 | B2 * | 1/2021 | Sawai | F16J 15/164 |

(Continued)

FOREIGN PATENT DOCUMENTS

| | | |
|---|---|---|
| CN | 201034182 Y | 3/2008 |
| JP | 3022489 | 3/2000 |

(Continued)

*Primary Examiner* — Eugene G Byrd
(74) *Attorney, Agent, or Firm* — Fish & Richardson P.C.

(57) ABSTRACT

A substrate processing apparatus includes an O-ring defined by a central axis, a first guide ring located closer to the central axis than is the O-ring, and a second guide ring located further from the central axis than is the O-ring. A thickness of each of the first guide ring and the second guide ring becomes progressively greater further from the central axis.

19 Claims, 12 Drawing Sheets

(56) References Cited

U.S. PATENT DOCUMENTS

| | | | | |
|---|---|---|---|---|
| 2010/0276895 | A1* | 11/2010 | Taylor | B23P 6/002 |
| | | | | 29/402.08 |
| 2017/0211703 | A1* | 7/2017 | Hatano | F16J 15/104 |
| 2018/0372223 | A1* | 12/2018 | Yoshitsune | F16J 15/3268 |
| 2020/0232563 | A1* | 7/2020 | Nobori | F16J 15/104 |
| 2021/0247011 | A1* | 8/2021 | Zhang | F16J 15/065 |
| 2022/0049571 | A1* | 2/2022 | Glaesman | F16J 15/3284 |
| 2023/0057490 | A1* | 2/2023 | Ichikawa | F16J 15/166 |

FOREIGN PATENT DOCUMENTS

| | | |
|---|---|---|
| JP | 2003-120602 | 4/2003 |
| JP | 5126462 | 1/2013 |
| KR | 10-2116475 | 5/2020 |

\* cited by examiner

SUBSTRATE PROCESSING APPARATUS

CROSS-REFERENCE TO RELATED APPLICATIONS

This U.S. non-provisional patent application claims priority under 35 U.S.C. § 119 to Korean Patent Application No. 10-2023-0132002, filed on Oct. 4, 2023, in the Korean Intellectual Property Office, the entire contents of which are hereby incorporated by reference.

BACKGROUND

A semiconductor device may be manufactured by various processes. For example, a semiconductor device may be manufactured by performing a photolithography process, an etching process, a deposition process, a plating process, etc. on a substrate. In processes for manufacturing a semiconductor device, various gases and fluids may be used. In a manufacturing process using the gas and/or the fluid, a sealing ring inserted in a sealing groove may be used to prevent a leakage of a chamber.

SUMMARY

The present disclosure relates to a sealing ring assembly, a substrate processing apparatus including the same, and a method of manufacturing a semiconductor device using the substrate processing apparatus, and more particularly, to a sealing ring assembly capable of sealing a space between a member and a member of a chamber, a substrate processing apparatus including the same, and a method of manufacturing a semiconductor device using the substrate processing apparatus.

Implementations of the present disclosure provide a sealing ring assembly capable of effectively sealing a space between members of a chamber, a substrate processing apparatus including the same, and a method of manufacturing a semiconductor device using the substrate processing apparatus.

In an aspect, a substrate processing apparatus may include an O-ring, a first guide ring located inside the O-ring relative to a central axis of the O-ring, and a second guide ring located outside the O-ring relative to a central axis of the O-ring. A thickness of each of the first guide ring and the second guide ring may become progressively greater away from the central axis.

In an aspect, a substrate processing apparatus may include a lower member, and an upper member coupled onto the lower member. A process space may be defined between the upper member and the lower member in a state in which the upper member is coupled onto the lower member. The lower member may provide a sealing groove recessed downward from a top surface of the lower member. A depth of the sealing groove may increase as a horizontal distance from the process space increases.

DETAILED DESCRIPTION

Hereinafter, implementations will be described in detail with reference to the accompanying drawings. The same reference numerals or the same reference designators may denote the same components or elements throughout the specification.

Figure 1:
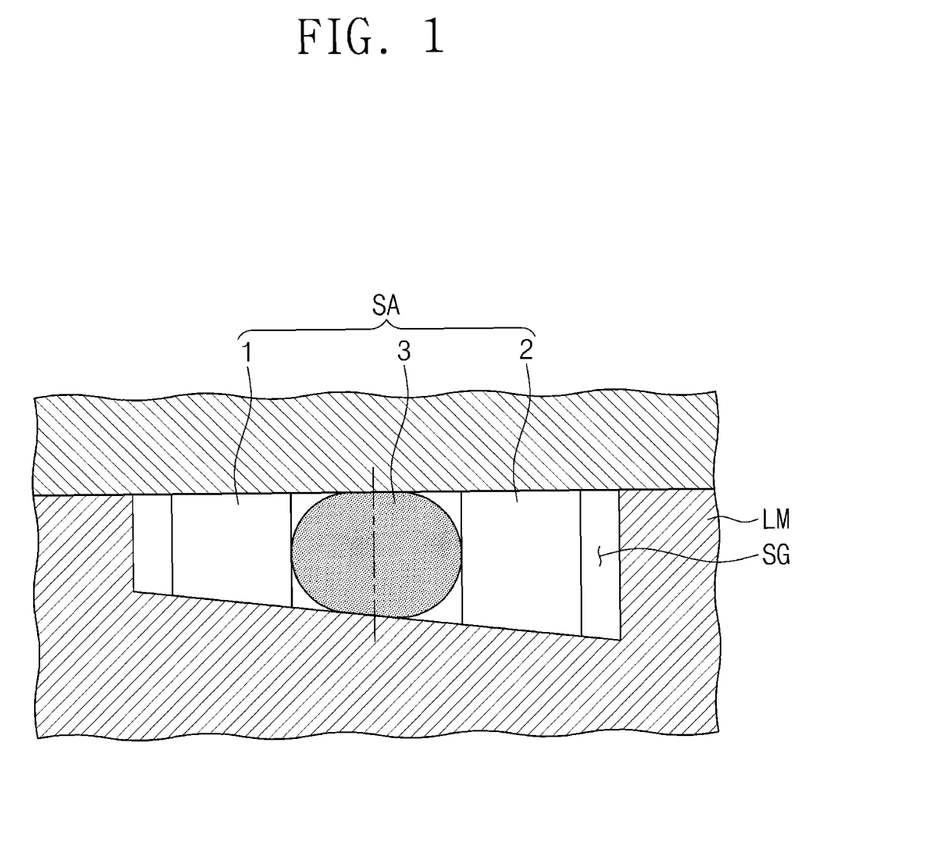
FIG. 1 is a cross-sectional view illustrating a state in which an example sealing ring assembly is inserted in a lower member.

FIG. 1 is a cross-sectional view illustrating an example lower member LM and an example sealing ring assembly SA.

Referring to FIG. 1, the lower member LM may be provided. The lower member LM may provide a sealing groove SG. The sealing groove SG may be recessed downward from a top surface of the lower member LM. A depth of the sealing groove SG may not be uniform. For example, the depth of the sealing groove SG may become progressively greater from the left toward the right of FIG. 1. The left of FIG. 1 may be referred to as an inside of the lower member LM. The right of FIG. 1 may be referred to as an outside of the lower member LM. In other words, the depth of the sealing groove SG may become progressively greater toward the outside of the lower member LM. More particularly, the sealing groove SG may have a trapezoid-shaped cross section, but implementations are not limited thereto. The sealing groove SG may extend in a circular shape. This will be described below in detail. For example, the lower member LM may include aluminum (Al) or a ceramic (e.g., $Al_2O_3$) material.

The sealing ring assembly SA may be provided in the sealing groove SG. In other words, the sealing ring assembly SA may be inserted in the sealing groove SG. The sealing ring assembly SA may include an O-ring 3, a first guide ring 1, and a second guide ring 2. The sealing ring assembly SA will be described below in more detail with reference to FIG. 2.

Figure 2:
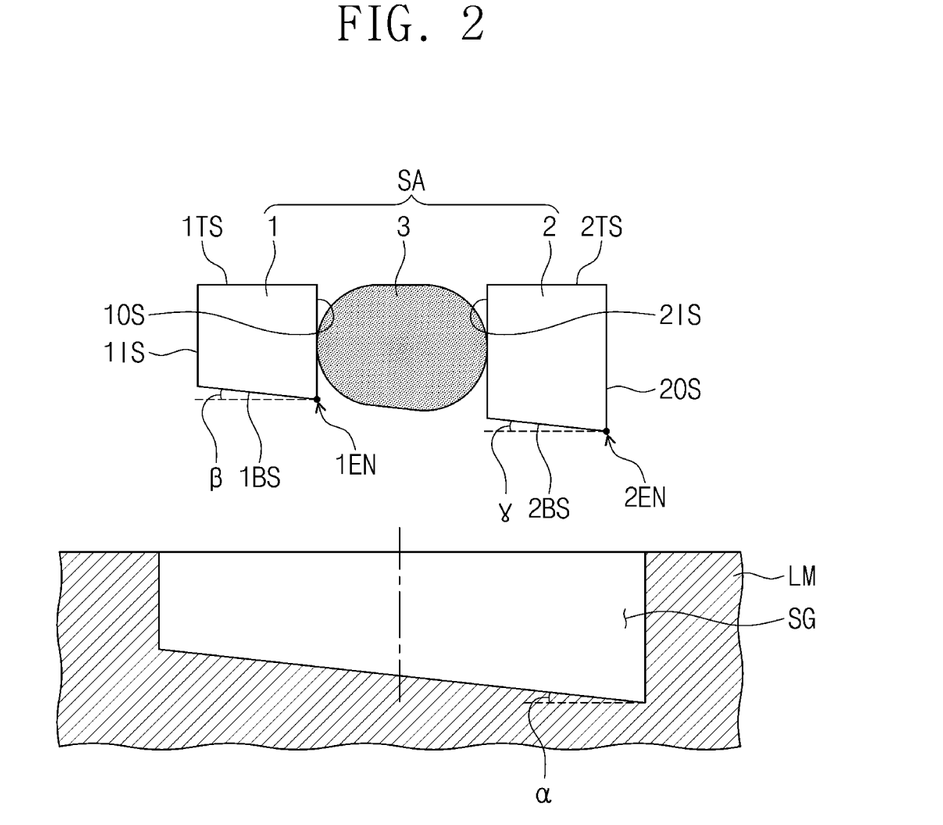
FIG. 2 is a view illustrating a state in which an example sealing ring assembly is disassembled from a lower member.

FIG. 2 is a cross-sectional view illustrating the example sealing ring assembly SA disassembled from the lower member LM of FIG. 1.

Referring to FIG. 2, the O-ring 3 may be inserted in the sealing groove SG. More particularly, the O-ring 3 may be inserted in a central portion of the sealing groove SG. The O-ring 3 may have a circular cross section. The O-ring 3 may seal a space between a first member and a second member. The O-ring 3 may have elasticity. For example, the O-ring 3 may be contracted in a low-temperature environment. More particularly, in the low-temperature environment, the O-ring 3 may be contracted, and thus a size of the cross section of the O-ring 3 may be reduced. In addition, in the low-temperature environment, the O-ring 3 may be contracted, and thus a diameter of the O-ring 3 may be reduced. The O-ring 3 may be expanded in a high-temperature environment. More particularly, in the high-temperature environment, the O-ring 3 may be expanded, and thus the size of the cross section of the O-ring 3 may be increased. In addition, in the high-temperature environment, the O-ring 3 may be expanded, and thus the diameter of the O-ring 3 may be increased. For this, the O-ring 3 may include a rubber material having elasticity. For example, the O-ring 3 may include a perfluoroelastomer (FFKM) material, but implementations are not limited thereto. The O-ring 3 may be movable along a bottom surface of the sealing groove SG toward the inside or the outside of the lower member LM.

The first guide ring 1 may be inserted in the sealing groove SG. More particularly, the first guide ring 1 may be located on the side the O-ring 3 closer to the inside of the sealing groove SG. A thickness of the first guide ring 1 may become progressively greater toward the outside of the sealing groove SG. For example, the first guide ring 1 may have a trapezoid-shaped cross section, but implementations are not limited thereto. A maximum thickness of the first guide ring 1 may be less than a minimum thickness of the second guide ring 2. The first guide ring 1 may include a top surface 1TS and a bottom surface 1BS. The top surface 1TS of the first guide ring 1 may include a flat surface. The bottom surface 1BS of the first guide ring 1 may form an acute angle with a horizontal direction. More particularly, in a cross-sectional view, the angle between the bottom surface 1BS of the first guide ring 1 and the horizontal direction may be referred to as a second angle $\beta$. The second angle $\beta$ may range from 1° to 5°. A coefficient of thermal expansion (CTE) of the first guide ring 1 may range from 0.8 times to 1.4 times a coefficient of thermal expansion of the O-ring 3. For this, the first guide ring 1 may include a tetron material, but implementations are not limited thereto. A level of a lower end 1EN of an outer side surface 1OS of the first guide ring 1 may be higher than a level of a lower end 2EN of an outer side surface 2OS of the second guide ring 2. The first guide ring 1 may be movable along the bottom surface of the sealing groove SG toward the inside of the lower member LM or the outside of the lower member LM.

The second guide ring 2 may be located at a side the O-ring 3 towards the outside of the sealing groove. A thickness of the second guide ring 2 may become progressively greater toward the outside of the sealing groove SG. For example, the second guide ring 2 may have a trapezoid-shaped cross section, but implementations are not limited thereto. The minimum thickness of the second guide ring 2 may be greater than the maximum thickness of the first guide ring 1. The second guide ring 2 may include a top surface 2TS and a bottom surface 2BS. The top surface 2TS of the second guide ring 2 may include a flat surface. The bottom surface 2BS of the second guide ring 2 may form an acute angle with the horizontal direction. More particularly, in a cross-sectional view, the angle between the bottom surface 2BS of the second guide ring 2 and the horizontal direction may be referred to as a third angle $\gamma$. The third angle $\gamma$ may range from 1° to 5°. A level of the top surface 2TS of the second guide ring 2 may be substantially the same as a level of the top surface 1TS of the first guide ring 1. A coefficient of thermal expansion of the second guide ring 2 may range from 0.8 times to 1.4 times the coefficient of thermal expansion of the O-ring 3. For this, the second guide ring 2 may include the tetron material, but implementations are not limited thereto. An inner side surface 2IS of the second guide ring 2 may be parallel to the outer side surface 1OS of the first guide ring 1. The level of the lower end 2EN of the outer side surface 2OS of the second guide ring 2 may be lower than the level of the lower end 1EN of the outer side surface 1OS of the first guide ring 1. The second guide ring 2 may be movable along the bottom surface of the sealing groove SG toward the inside of the lower member LM or the outside of the lower member LM.

The bottom surface (not indicated by a reference designator) of the sealing groove SG may form an acute angle with the horizontal direction. For example, the angle between the bottom surface of the sealing groove SG and the horizontal direction may be referred to as a first angle $\alpha$. The first angle $\alpha$ may range from 1° to 5°. In some implementations, the first angle $\alpha$, the second angle $\beta$ and the third angle $\gamma$ may be equal to each other, but implementations are not limited thereto.

Figure 3:
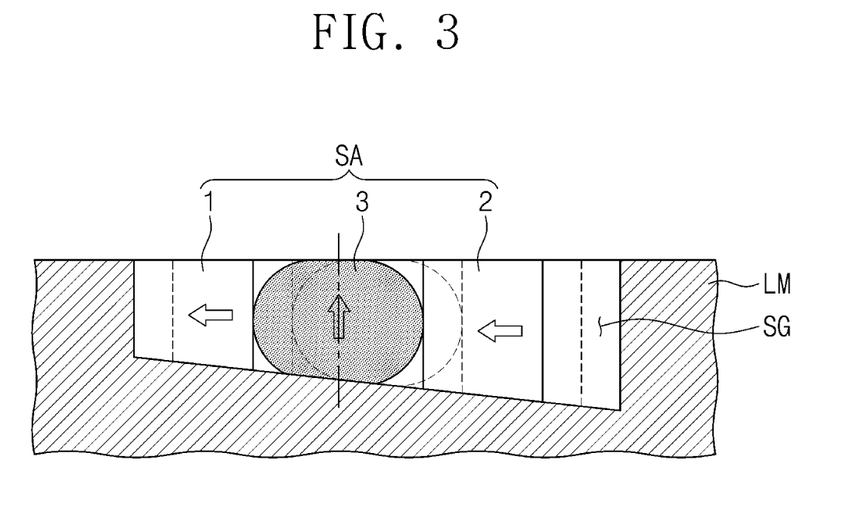
FIGS. 3 and 4 are views illustrating movement directions of an example sealing ring assembly.
Figure 4:
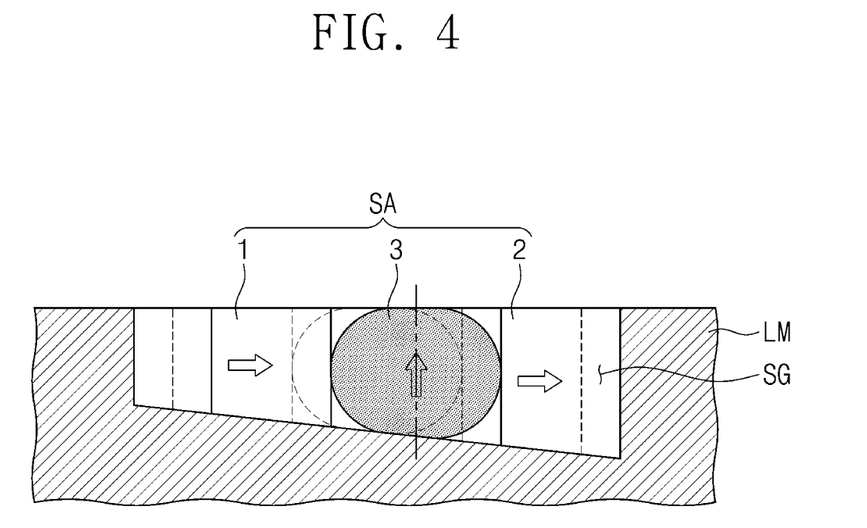

FIGS. 3 and 4 are views illustrating movement directions of the example sealing ring assembly SA.

Hereinafter, the descriptions to the same/similar features as mentioned with reference to FIG. 2 will be omitted for the purpose of ease and convenience in explanation.

Referring to FIG. 3, a movement direction of the sealing ring assembly SA in the low-temperature environment may be provided. A diameter contraction phenomenon of the first guide ring 1 and the second guide ring 2 may be generated in the low-temperature environment. The first guide ring 1 and the second guide ring 2 may move along the bottom surface of the sealing groove SG toward the inside of the lower member LM. In other words, the first guide ring 1 and the second guide ring 2 may move in a direction toward the inside of the lower member LM. The first guide ring 1 and the second guide ring 2 may be thermally deformed. More particularly, the first guide ring 1 and the second guide ring 2 may be compressed while moving toward the inside of the lower member LM. In addition, volumes of the first guide ring 1 and the second guide ring 2 may be reduced. In other words, the volumes of the first guide ring 1 and the second guide ring 2 may be reduced by the movement toward the inside of the lower member LM.

Cross-sectional area contraction and diameter contraction phenomenon of the O-ring 3 may be generated. The O-ring 3 may move while being located between the first guide ring 1 and the second guide ring 2. The O-ring 3 may rise while moving toward the inside of the lower member LM. In other words, the O-ring 3 may be moved by the second guide ring 2 in the direction toward the inside of the lower member LM. The O-ring 3 may be thermally deformed. More particularly, the O-ring 3 may be compressed while moving toward the inside of the lower member LM. A height of a center of the O-ring 3 may rise while the O-ring 3 moves toward the inside of the lower member LM.

Referring to FIG. 4, a movement direction of the sealing ring assembly SA in the high-temperature environment may be provided. A diameter expansion phenomenon of the first guide ring 1 and the second guide ring 2 may be generated in the high-temperature environment. The first guide ring 1 and the second guide ring 2 may move along the bottom surface of the sealing groove SG toward the outside of the lower member LM. In other words, the first guide ring 1 and the second guide ring 2 may move in a direction toward the outside of the lower member LM. The first guide ring 1 and the second guide ring 2 may be thermally deformed. More particularly, the first guide ring 1 and the second guide ring 2 may move toward the outside of the lower member LM while being expanded. In addition, the volumes of the first guide ring 1 and the second guide ring 2 may be increased. In other words, the first guide ring 1 and the second guide ring 2 may move toward the outside of the lower member LM by the increases in cross-sectional volume thereof.

Cross-sectional area expansion and diameter expansion phenomenon of the O-ring 3 may be generated. The O-ring 3 may move while being located between the first guide ring 1 and the second guide ring 2. The O-ring 3 may move toward the outside of the lower member LM while descending along the gradient shape. In other words, the O-ring 3 may be moved by the first guide ring 1 in the direction toward the outside of the lower member LM. The O-ring 3 may be thermally deformed. More particularly, the volume of the O-ring 3 may be increased due to its cross-sectional expansion. The height of the center of the O-ring 3 may be lowered while the O-ring 3 moves toward the outside of the lower member LM.

Figure 5:
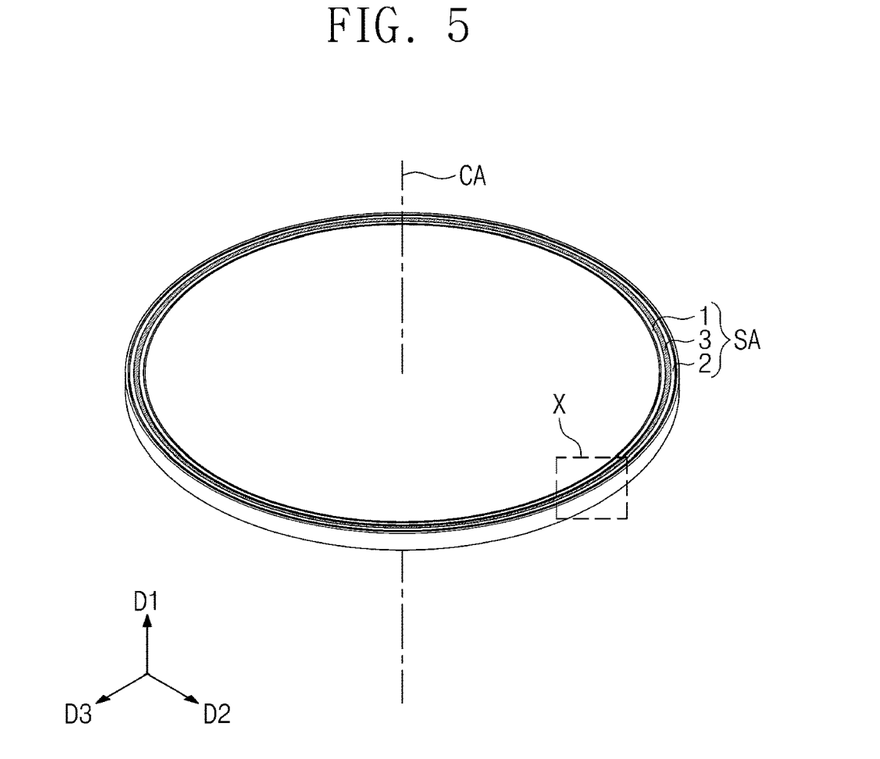
FIG. 5 is a perspective view illustrating a lower member and an example sealing ring assembly.
Figure 6:
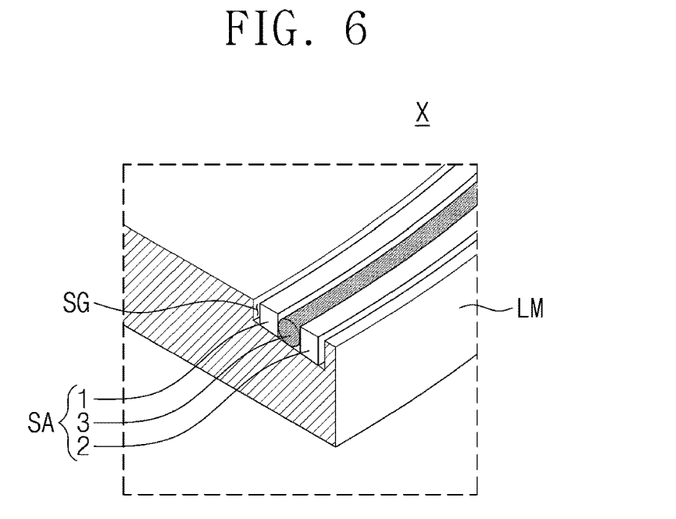
FIG. 6 is an enlarged view of a portion of FIG. 5 to illustrate a lower member.

FIG. 5 is a perspective view illustrating the example lower member and the example sealing ring assembly, and FIG. 6 is an enlarged view of a portion of FIG. 5 to illustrate the lower member.

Hereinafter, a direction D1 of FIG. 5 may be referred to as a first direction, a direction D2 intersecting the first direction D1 may be referred to as a second direction, and a direction D3 intersecting both the first direction D1 and the second direction D2 may be referred to as a third direction. The first direction D1 may also be referred to as an upward direction, and an opposite direction to the first direction D1 may also be referred to as a downward direction. Alternatively, the first direction D1 may be referred to as a vertical direction. In addition, each of the second direction D2 and the third direction D3 may be referred to as a horizontal direction.

Referring to FIGS. 5 and 6, the O-ring 3 may have a ring shape having a central axis extending in the first direction D1. The O-ring 3 may have a circular cross section. The O-ring 3 may seal a space between an apparatus and an apparatus.

The first guide ring 1 may have a ring shape having a central axis extending in the first direction D1. The first guide ring 1 may be located closer to the central axis than the O-ring 3.

The second guide ring 2 may have a ring shape having a central axis extending in the first direction D1. The second guide ring 2 may be located further from the central axis than the O-ring 3.

FIGS. 7 to 10 are cross-sectional views illustrating example substrate processing apparatuses.

Hereinafter, the descriptions to the same/similar features as mentioned with reference to FIGS. 1 to 6 will be omitted for the purpose of ease and convenience in explanation.

Figure 7:
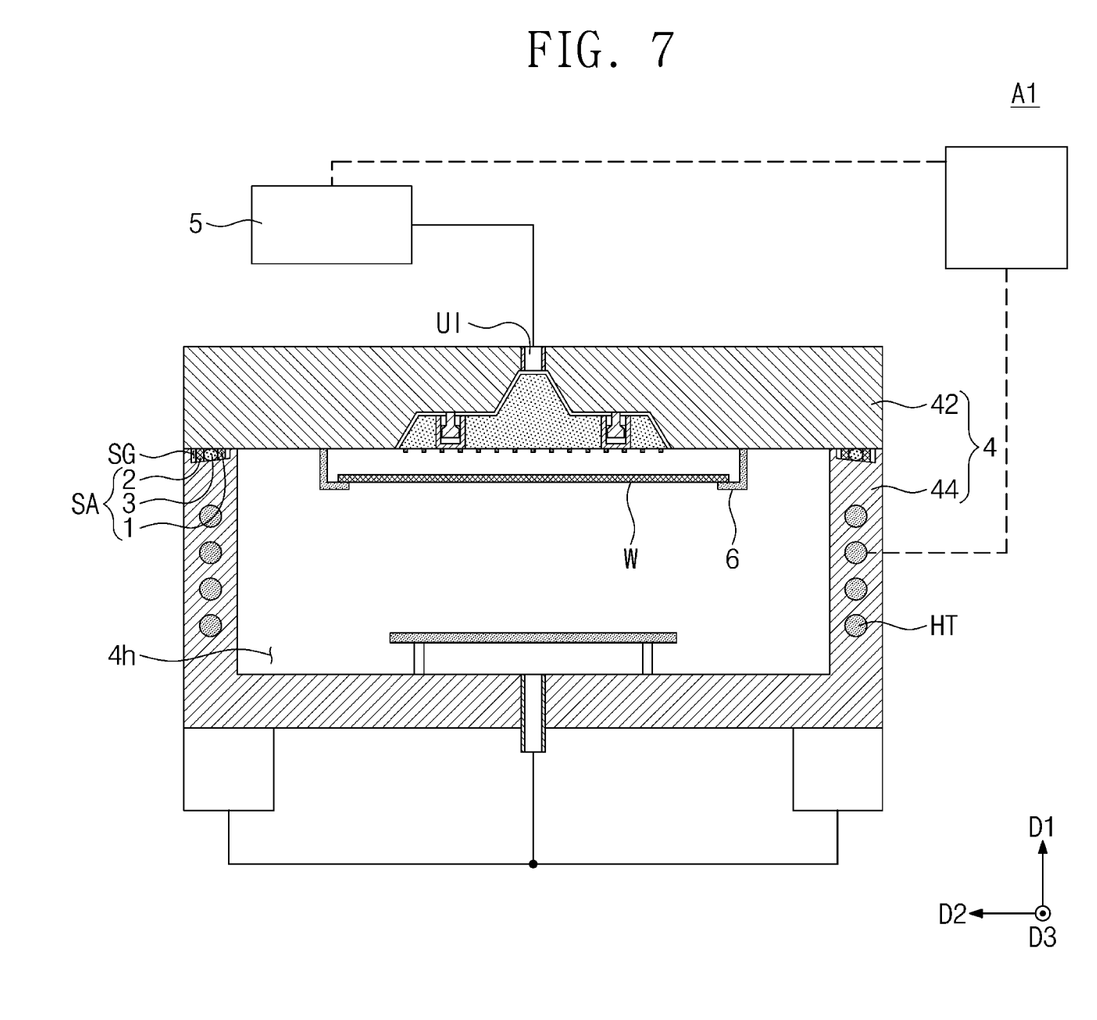
FIGS. 7 to 10 are cross-sectional views illustrating example substrate processing apparatuses.

Referring to FIG. 7, a substrate processing apparatus A1 may be provided. The substrate processing apparatus A1 may be an apparatus of processing a substrate W (e.g., a semiconductor substrate). The substrate processing apparatus A1 may perform a drying process on the substrate W. More particularly, the substrate processing apparatus A1 may be an apparatus of removing liquid, provided on the substrate W, from the substrate W by using a supercritical fluid. The substrate processing apparatus A1 may include a drying chamber housing 4, a sealing ring assembly SA, a drying heater HT, a supercritical fluid supply unit 5, and a drying chuck 6.

The drying chamber housing 4 may provide a drying space 4h. The drying space 4h may also be referred to as a process space. The drying chamber housing 4 may include a lower member 44 and an upper member 42. The lower member 44 may be selectively coupled to the upper member 42. The drying space 4h may be provided between the lower member 44 and the upper member 42. The lower member 44 and the upper member 42 may be coupled to each other to isolate the drying space 4h from the outside environment. For example, the drying space may have fumes dangerous for humans to breathe and so are isolated from the outside environment which is safe for humans. A fluid inlet UI may be provided at the upper member 42. The fluid inlet UI may be connected to the supercritical fluid supply unit 5. The supercritical fluid may be supplied from the supercritical fluid supply unit 5 into the drying space 4h through the fluid inlet UI.

The lower member 44 may provide a sealing groove SG. More particularly, the sealing groove SG may be recessed downward from a top surface of the lower member 44. A depth of the sealing groove SG may increase as a horizontal distance from the drying space 4h increases.

The sealing ring assembly SA may seal a space between the lower member 44 and the upper member 42. The sealing ring assembly SA may include an O-ring 3, a first guide ring 1, and a second guide ring 2. The O-ring 3 may be inserted in the sealing groove SG. The O-ring 3 may seal the space between the lower member 44 and the upper member 42. In other words, due to the O-ring 3, the supercritical fluid provided in the drying space 4h may be confined to the process space and may not leak to the outside environment. The O-ring 3 may be movable along a bottom surface of the sealing groove SG toward the process space 4h or away from the process space 4h.

The first guide ring 1 and the second guide ring 2 may be inserted in the sealing groove SG and may be located on both sides of the O-ring 3. In other words, due to the first guide ring 1 and the second guide ring 2, the supercritical fluid in the drying space 4h may not leak. The first guide ring 1 may guide the O-ring 3.

The drying heater HT may be coupled to the drying chamber housing 4. The drying heater HT may be configured to heat the drying space 4h. The supercritical fluid in the drying space 4h may be maintained in a supercritical state by the heating of the drying heater HT.

The drying chuck 6 may be connected to the upper member 42. The drying chuck 6 may be coupled to the upper member 42. The substrate W may be disposed on the drying chuck 6. In other words, the drying chuck 6 may support the substrate W.

Figure 8:
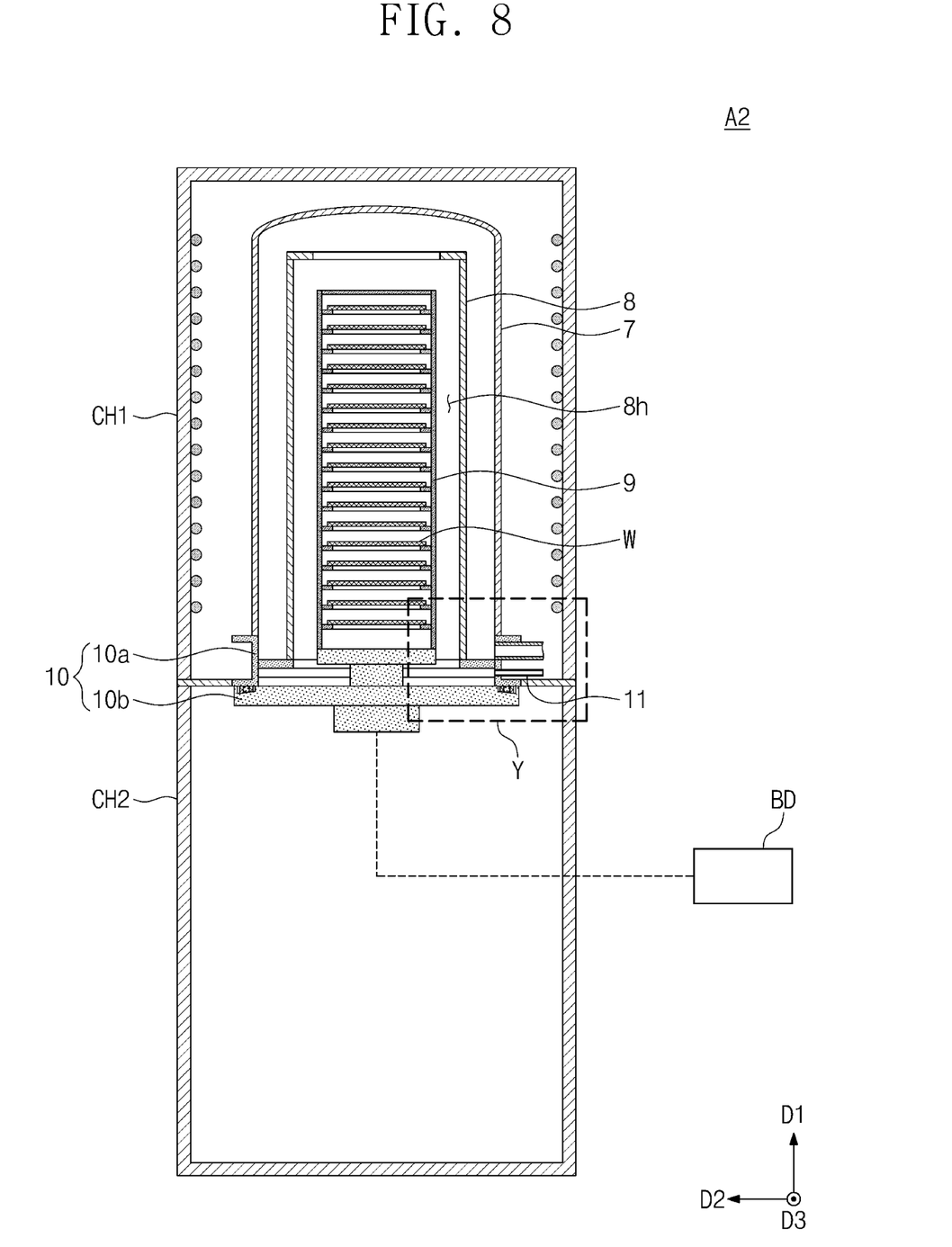

Referring to FIG. 8, a substrate processing apparatus A2 may be provided. The substrate processing apparatus A2 may be an apparatus of processing a substrate W (e.g., a semiconductor substrate). More particularly, the substrate processing apparatus A2 may be configured to perform a deposition process on the substrate W. A plurality of stacked substrates W may be processed in the substrate processing apparatus A2. The substrate processing apparatus A2 may include an upper chamber CH1, a lower chamber CH2, an outer tube 7, an inner tube 8, a gas supply pipe 11, an upper member 10a, a lower member 10b, a sealing ring assembly SA (see FIG. 9), and a boat 9.

The upper chamber CH1 may surround the outer tube 7 and the inner tube 8. In other words, the outer tube 7, the inner tube 8 and a heater unit (not indicated by a reference designator) may be disposed in the upper chamber CH1. The upper chamber CH1 may support the heater unit. For example, the heater unit may be coupled to an inner surface of a wall of the upper chamber CH1. However, implementations are not limited thereto, and in certain implementations, the heater unit may be disposed at a position spaced apart from the inner surface of the wall of the upper chamber CH1.

The lower chamber CH2 may be located under the upper chamber CH1. The boat 9 may be vertically movable between the lower chamber CH2 and the upper chamber CH1. The substrates W may be loaded in the boat 9 in a state in which the boat 9 is disposed in the lower chamber CH2.

A process (e.g., the deposition process) may be performed on the substrates W in a state in which the boat 9 is disposed in the upper chamber CH1.

The outer tube 7 may surround the inner tube 8. A process space may be provided between the outer tube 7 and the inner tube 8. In other words, an inner side surface of the outer tube 7 may be spaced apart from an outer side surface of the inner tube 8. The outer tube 7 may be located in the upper chamber CH1. The outer tube 7 may extend in the first direction D1.

The inner tube 8 may be located in the outer tube 7. The inner tube 8 may extend in the first direction D1. The boat 9 may be disposed in the inner tube 8. More particularly, when the boat 9 rises to be inserted in the upper chamber CH1, the boat 9 may be located in the inner tube 8. The inner tube 8 may provide a process space 8*h*.

The gas supply pipe 11 may be connected to a space in the inner tube 8. In other words, the gas supply pipe 11 may be connected to the process space 8*h*. The gas supply pipe 11 may be used to supply a process gas into the inner tube 8. The deposition process may be performed on the substrate W in the boat 9 by the process gas supplied through the gas supply pipe 11.

The upper member 10*a* may be located under the outer tube 7. The upper member 10*a* may support the outer tube 7 and/or the inner tube 8. Alternatively, the upper member 10*a* may surround the inner tube 8. The gas supply pipe 11 may be coupled to the upper member 10*a*.

The lower member 10*b* may be located on a boat driving unit BD. The lower member 10*b* may support the boat 9. The lower member 10*b* may be coupled to the upper member 10*a*. The lower member 10*b* may have a circular plate shape. The lower member 10*b* will be described below in more detail with reference to FIG. 9.

The boat 9 may support the substrate W. In other words, the substrate W may be disposed in the boat 9. The boat 9 may be supported by the lower member 10*b* and may be movable vertically. For example, the boat 9 may be raised or lowered by the boat driving unit BD. The plurality of substrates W may be loaded in a single boat 9. For this, the boat 9 may include a plurality of substrate supporting members (not indicated by a reference designator) vertically spaced apart from each other. The plurality of substrates W may be arranged in the first direction D1 in the boat 9.

Figure 9:
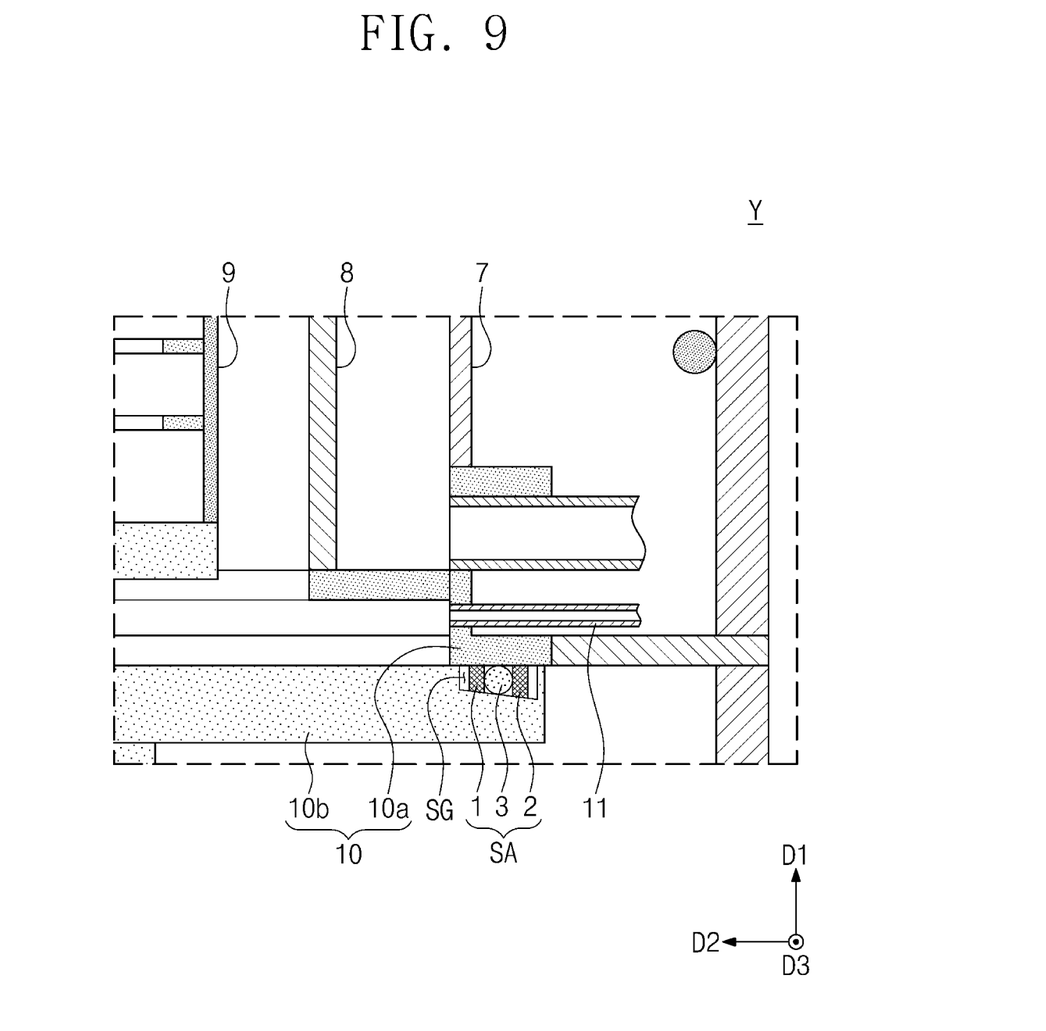

Referring to FIG. 9, the lower member 10*b* may be located under the upper member 10*a*. The lower member 10*b* may provide a sealing groove SG.

The sealing groove SG may be recessed downward from a top surface of the lower member 10*b*. A depth of the sealing groove SG may become progressively greater toward the outside of the lower member 10*b*. The sealing ring assembly SA may be inserted in the sealing groove SG.

The sealing ring assembly SA may include an O-ring 3, a first guide ring 1, and a second guide ring 2. The O-ring 3 may be inserted in the sealing groove SG and may be disposed in a central portion of the sealing groove SG. The first guide ring 1 and the second guide ring 2 may be inserted in the sealing groove SG and may be disposed at both sides of the O-ring 3.

Figure 10:
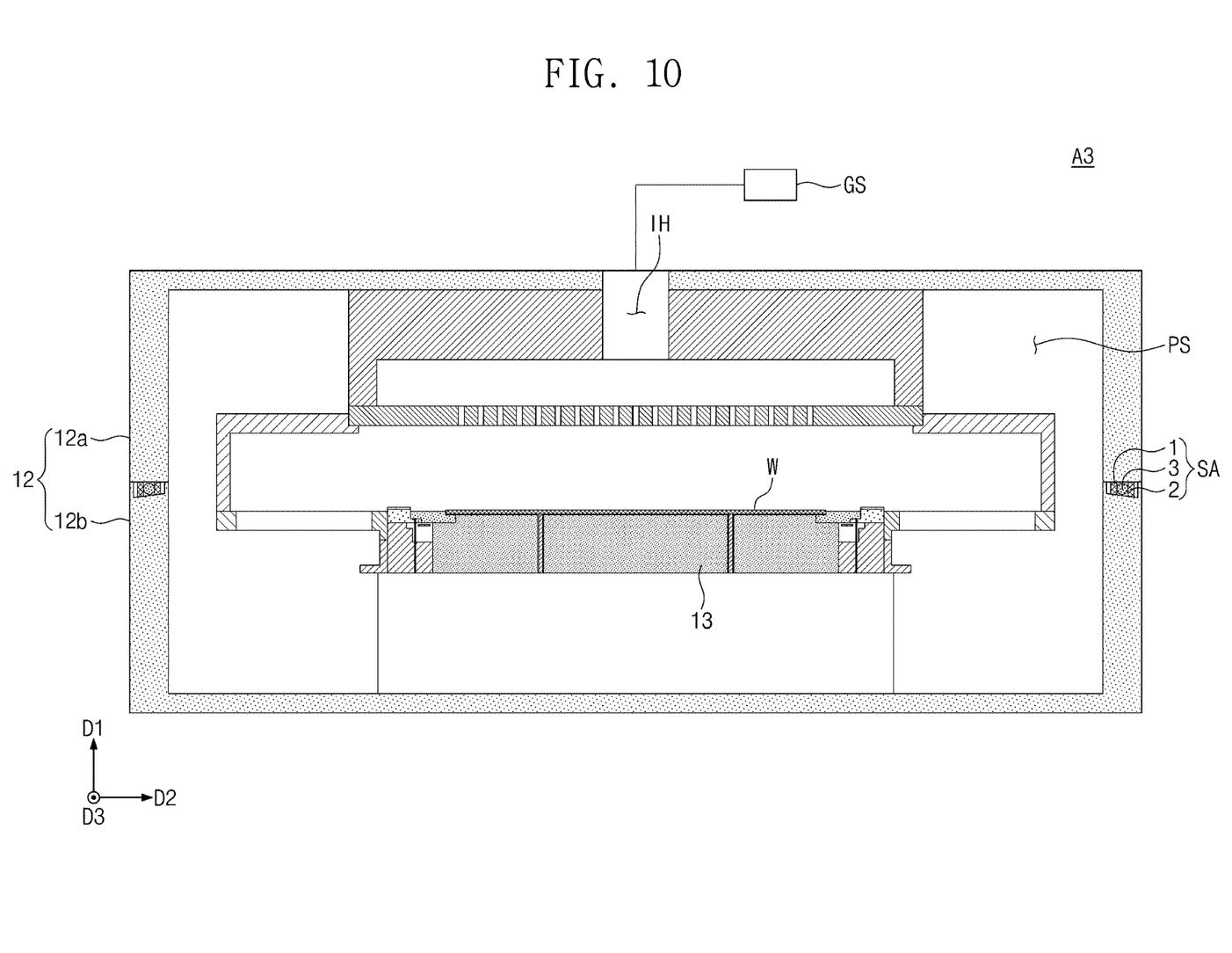

Referring to FIG. 10, a substrate processing apparatus A3 may be provided. The substrate processing apparatus A3 may be an apparatus of etching a substrate. More particularly, the substrate processing apparatus A3 may mean an apparatus of etching one surface of a substrate W by using plasma. The substrate processing apparatus A3 may generate the plasma by at least one of various methods.

The substrate processing apparatus A3 may include a chamber 12, a sealing ring assembly SA, a gas supply unit GS, and an electrostatic chuck 13. The chamber 12 may include a lower member 12*b* and an upper member 12*a*. The lower member 12*b* may be selectively coupled to the upper member 12*a*. A process space PS may be provided between the lower member 12*b* and the upper member 12*a*. The lower member 12*b* and the upper member 12*a* may be coupled to each other to isolate the process space PS from the outside environment. A gas inlet IH may be provided at the upper member 12*a*. The gas inlet IH may be connected to the gas supply unit GS. A process gas may be supplied from the gas supply unit GS into the process space PS through the gas inlet IH.

The lower member 12*b* may provide a sealing groove SG. More particularly, the sealing groove SG may be recessed downward from a top surface of the lower member 12*b*. A depth of the sealing groove SG may become progressively greater toward the outside of the lower member 12*b*. The sealing ring assembly SA may be inserted in the sealing groove SG.

The sealing ring assembly SA may seal a space between the lower member 12*b* and the upper member 12*a*. The sealing ring assembly SA may include an O-ring 3, a first guide ring 1, and a second guide ring 2. The O-ring 3 may be located in a central portion of the sealing groove SG. The first guide ring 1 and the second guide ring 2 may be located in the sealing groove SG and may be located at both sides of the O-ring 3.

The electrostatic chuck 13 may be disposed in the process space PS and may be configured to support the substrate W. For example, when the substrate W is disposed on the electrostatic chuck 13, the electrostatic chuck 13 may fix or hold the substrate W at a certain position by using electrostatic force. The electrostatic chuck 13 may include a plasma electrode for generating plasma.

Figure 11:
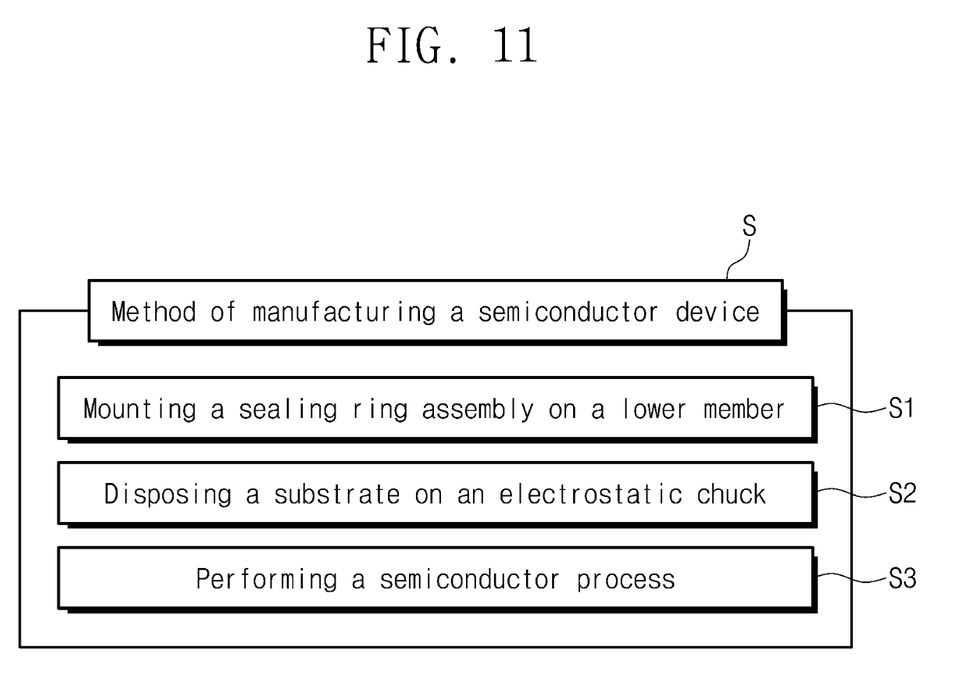
FIG. 11 is a flow chart illustrating an example method of manufacturing a semiconductor device.

Referring to FIG. 11, an example method of manufacturing a semiconductor device(S) may be provided. The method of manufacturing a semiconductor device(S) may be a method of manufacturing a semiconductor device using the substrate processing apparatus A3 described with reference to FIG. 10. The method of manufacturing a semiconductor device(S) may include mounting the sealing ring assembly SA on the lower member 12*b* (S1), disposing the substrate W on the electrostatic chuck 13 (S2), and performing a semiconductor process (S3).

Figure 12:
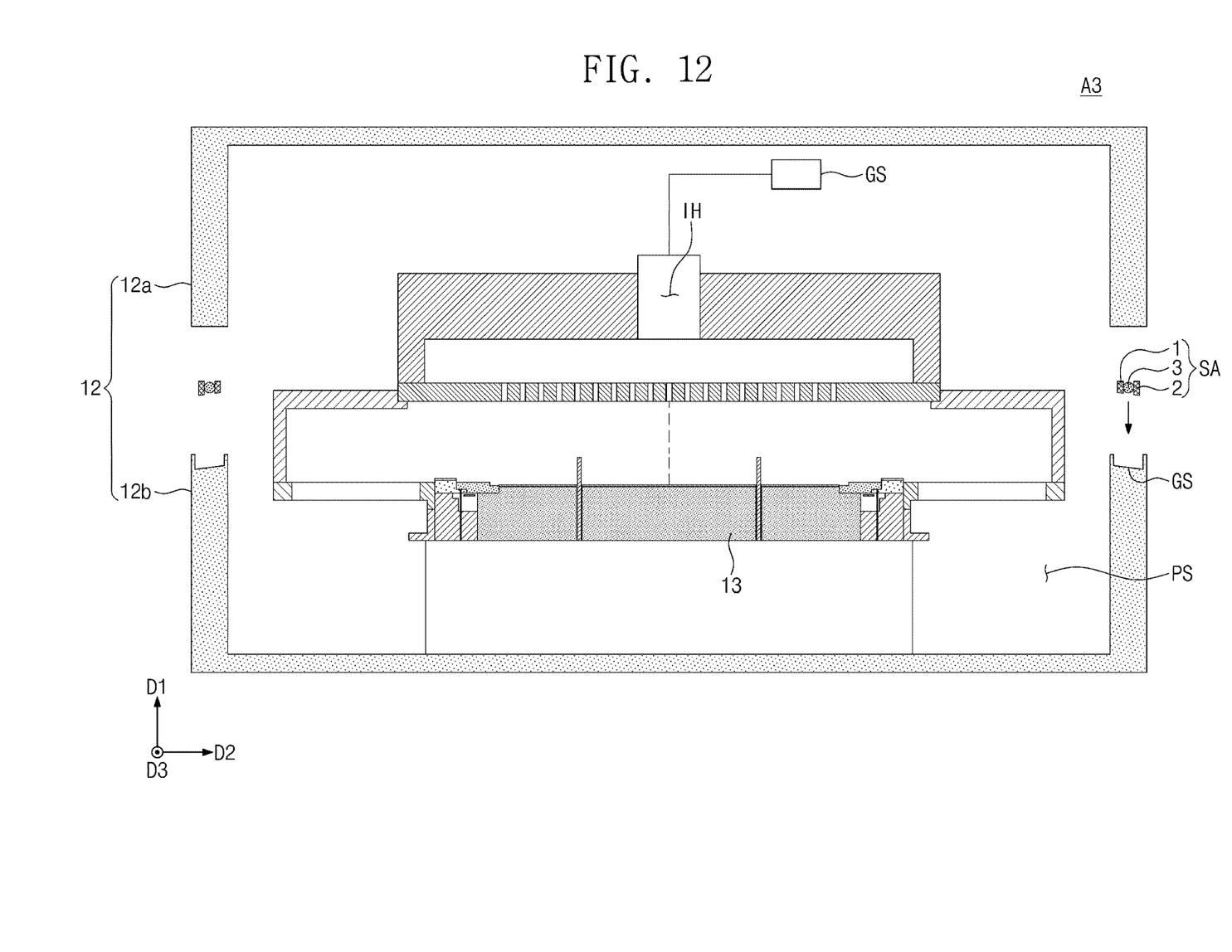
FIGS. 12 to 14 are cross-sectional views illustrating an example method of manufacturing a semiconductor device.
Figure 13:
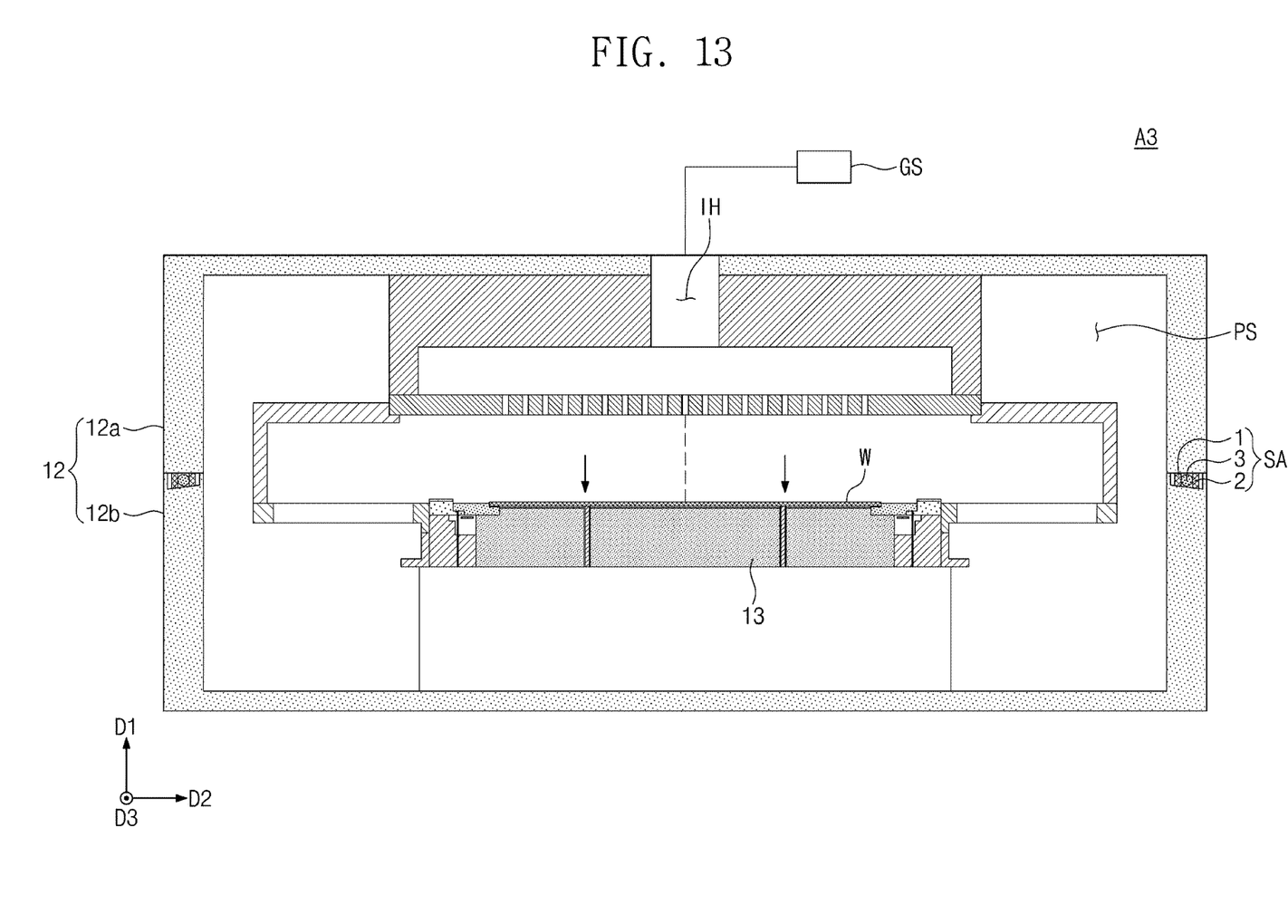
Figure 14:
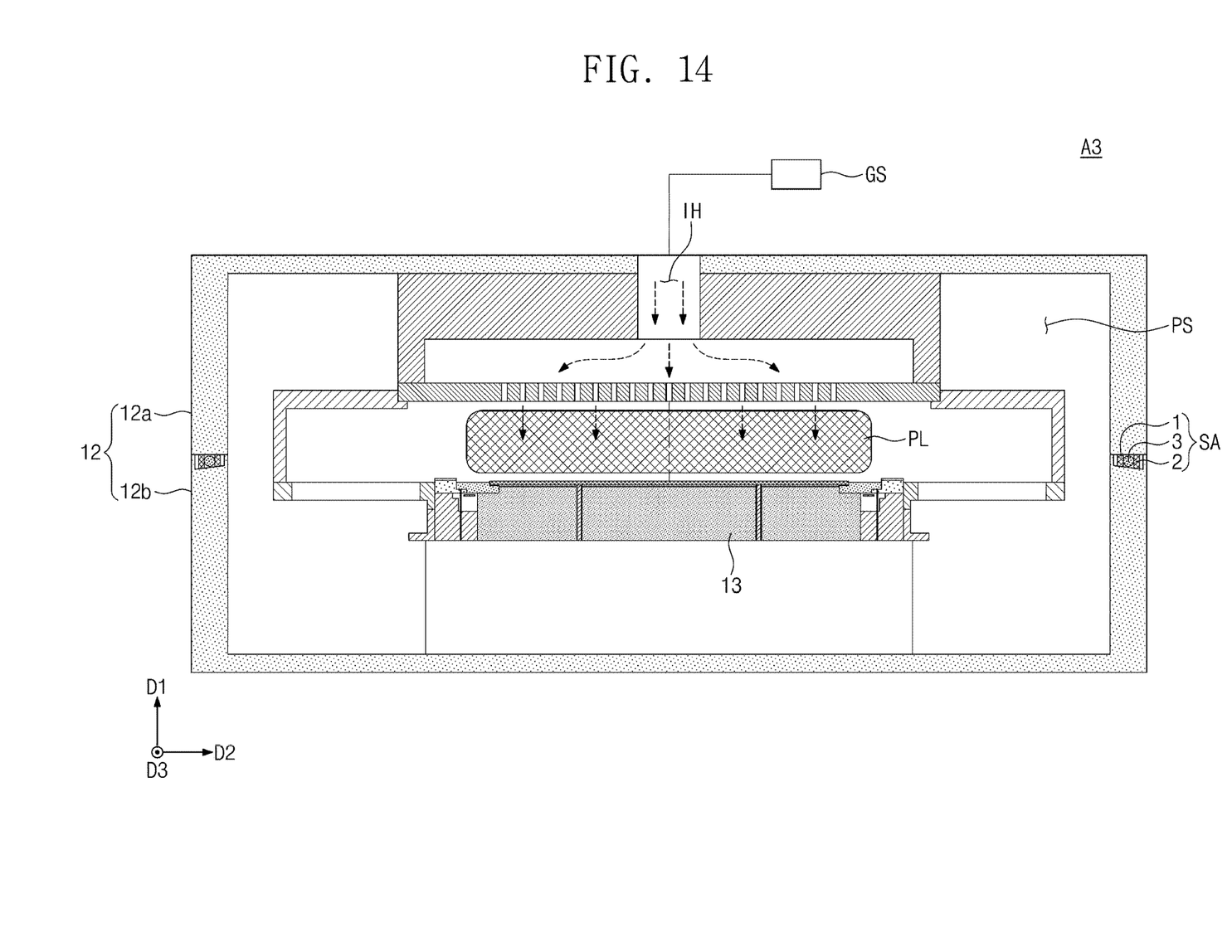

Hereinafter, the example method of manufacturing a semiconductor device(S) in FIG. 11 will be described with reference to FIGS. 12 to 14. FIGS. 12 to 14 are cross-sectional views illustrating the example method of manufacturing a semiconductor device(S).

Referring to FIG. 12, the mounting of the sealing ring assembly SA on the lower member 12*b* (S1) may include mounting the sealing ring assembly SA in the sealing groove SG provided in the top surface of the lower member 12*b*. The mounting of the sealing ring assembly SA in the sealing groove SG may be performed by an operator. The lower member 12*b* on which the sealing ring assembly SA is mounted may be coupled to the upper member 12*a*. The sealing ring assembly SA may be mounted to seal the space between the lower member 12*b* and the upper member 12*a*.

Referring to FIG. 13, the disposing of the substrate W on the electrostatic chuck 13 (S2) may include disposing the substrate W on a substrate lift pin (not indicated by a reference designator) raised by a substrate lift pin driving unit (not shown). The substrate W may mean, but is not limited to, a silicon wafer. The substrate W may be disposed on the electrostatic chuck 13. More particularly, the substrate W may be placed on a top surface of the electrostatic chuck 13. The electrostatic chuck 13 may fix or hold the substrate W at a certain position by using electrostatic force provided by an electrode of the chuck.

Referring to FIG. 14, the performing of the semiconductor process (S3) may include supplying RF power (not indicated by a reference designator) to the plasma electrode (not indicated by a reference designator). The supplying of the RF power to the plasma electrode may be performed by an RF power supply unit. The plasma electrode supplied with the RF power may form an electric field in a space on the substrate W. Plasma PL may be formed in the space on the substrate W by the electric field and the process gas. For example, the semiconductor process may be a semiconductor process using the plasma PL (more particularly, an etching process using the plasma PL). Thus, a portion of a top surface of the substrate W may be etched by the plasma PL.

Accordingly the sealing ring assembly, the substrate processing apparatus including the same and the method of manufacturing a semiconductor device using the same in the implementations, the sealing groove may be provided in the lower member of the substrate processing apparatus. The sealing ring assembly may be inserted in the sealing groove. The space between the lower member and the upper member may be sealed by the sealing ring assembly. Thus, it is possible to prevent leakage and/or etching of the sealing ring assembly, and process efficiency may be increased. More particularly, even though the O-ring is thermally deformed, the O-ring may be contracted/expanded while being moved to the inside/outside of the lower member by the first guide ring and the second guide ring.

Accordingly the sealing ring assembly, the substrate processing apparatus including the same and the method of manufacturing a semiconductor device using the same in the implementations, the space between the members of the chamber may be effectively sealed.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While the implementations have been particularly shown and described, it will be understood by one of ordinary skill in the art that variations in form and detail may be made therein without departing from the spirit and scope of the attached claims.

What is claimed is:

1. A system comprising
a substrate processing apparatus comprising:
  a lower member with a sealing groove;
  an upper member configured to be coupled onto the lower member, wherein a process space is defined between the upper member and the lower member;
  an electrostatic chuck in the process space;
  an O-ring having a central axis and in the sealing groove;
  a first guide ring located along an inner side surface of the O-ring closer to the central axis; and
  a second guide ring located along an outer side surface of the O-ring further from the central axis,
  wherein the electrostatic chuck is configured to support a substrate and comprises a plasma electrode configured to generate a plasma,
  wherein a thickness, parallel to the central axis, of each of the first guide ring and the second guide ring becomes progressively greater further from the central axis, and
  wherein a height of a center of the O-ring is greater than a minimum thickness of the first guide ring and less than a maximum thickness of the second guide ring.

2. The system of claim 1, wherein a maximum thickness of the first guide ring is less than a minimum thickness of the second guide ring.

3. The system of claim 1, wherein an angle between a bottom surface of the first guide ring and a horizontal direction perpendicular to the central axis ranges from 1° to 5°.

4. The system of claim 1, wherein a top surface of the first guide ring includes a flat surface.

5. The system of claim 1, wherein each of the first guide ring and the second guide ring has a trapezoid-shaped cross section.

6. The system of claim 1, wherein a level of a top surface of the second guide ring is the same as a level of a top surface of the first guide ring.

7. The system of claim 1, wherein a level of a lower end of an outer side surface of the first guide ring is higher than a level of a lower end of an outer side surface of the second guide ring.

8. The system of claim 1, wherein the first guide ring and the second guide ring include a tetron material.

9. The system of claim 1, wherein a coefficient of thermal expansion (CTE) of the first guide ring ranges from 0.8 times to 1.4 times a coefficient of thermal expansion of the O-ring.

10. The system of claim 1, wherein the O-ring includes a perfluoroelastomer (FFKM).

11. The system of claim 1, wherein an outer side surface of the first guide ring further from the central axis is parallel to an inner side surface of the second guide ring closer to the central axis when viewed in a cross-sectional view.

12. A system comprising
a substrate processing apparatus comprising:
  a lower member;
  an upper member coupled onto the lower member defining a process space between the upper member and the lower member in a state in which the upper member is coupled onto the lower member; and
  an electrostatic chuck in the process space and configured to support a substrate,
  wherein the electrostatic chuck comprises a plasma electrode configured to generate a plasma,
  wherein the lower member provides a sealing groove recessed downward from a top surface of the lower member, and
  wherein a depth of the sealing groove increases continuously as a horizontal distance from the process space increases.

13. The system of claim 12, wherein the substrate processing apparatus further comprises:
a sealing ring assembly inserted in the sealing groove, wherein the sealing ring assembly comprises: an O-ring.

14. The system of claim 13, wherein the sealing ring assembly further comprises:
   a first guide ring located next to the O-ring and closer to the process space than the O-ring; and
   a second guide ring located next to the O-ring and further from the process space than the O-ring.

15. The system of claim 14, wherein a thickness, parallel to the depth of the sealing groove, of each of the first guide ring and the second guide ring becomes progressively greater further from the process space.

16. The system of claim 12, wherein the sealing groove has a trapezoid-shaped cross section.

17. The system of claim 12, wherein the sealing groove extends in a circular shape to encircle the process space.

18. The system of claim 14, wherein an angle between a bottom surface of the first guide ring and a horizontal direction parallel to the top surface of the lower member ranges from 1° to 5°.

19. A system comprising
a substrate processing apparatus comprising:
   a lower member;
   an upper member coupled onto the lower member defining a process space between the upper member and the lower member in a state in which the upper member is coupled onto the lower member; and
   a boat in the process space,
   wherein the boat comprises a plurality of substrate supporting members vertically spaced apart from each other,
   wherein the boat is supported by the lower member and is movable vertically,
   wherein the lower member provides a sealing groove recessed downward from a top surface of the lower member, and
   wherein a depth of the sealing groove increases continuously as a horizontal distance from the process space increases.

* * * * *